United States Patent
Huang

(10) Patent No.: US 6,392,926 B1
(45) Date of Patent: May 21, 2002

(54) COUPLING CIRCUIT FOR PREVENTING GATE JUNCTION BREAKDOWN OF FLASH MEMORIES

(75) Inventor: Chung-Meng Huang, Hsinchu (TW)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 09/966,187

(22) Filed: Sep. 28, 2001

(30) Foreign Application Priority Data

Apr. 27, 2001 (TW) .......................................... 90110202

(51) Int. Cl.[7] .............................................. G11C 16/30
(52) U.S. Cl. ................................ 365/185.09; 365/185.33
(58) Field of Search ........................ 365/185.33, 185.09, 365/185.18

(56) References Cited

U.S. PATENT DOCUMENTS

| | | | | |
|---|---|---|---|---|
| 4,306,185 A | * | 12/1981 | Leuschner | 323/312 |
| 5,493,244 A | * | 2/1996 | Pathak et al. | 327/313 |
| 5,946,175 A | * | 8/1999 | Yu | 361/56 |
| 6,096,610 A | * | 8/2000 | Alavi et al. | 438/286 |
| 6,108,181 A | * | 8/2000 | Gerosa | 361/56 |
| 6,160,739 A | * | 12/2000 | Wong | 365/185.29 |

\* cited by examiner

*Primary Examiner*—Andrew Q. Tran
(74) *Attorney, Agent, or Firm*—Ladas & Parry

(57) ABSTRACT

The present invention discloses an NMOS coupling circuit for preventing gate junction breakdown of a flash memory. The present invention adds at least one isolating stage between a conducting stage and a high voltage HV of the prior coupling circuit, and the addition generates a benefit that the voltage difference of the high voltage HV is burdened by both the conducting stage and the isolating stage of the coupling circuit. In other words, the voltage difference in the gate junction of the conducting stage will be reduced, and the probability of punching through a transistor will also be reduced. For reducing the effect of an instant voltage difference when the high voltage HV is enabled, the present invention electrically connects one end of a diode to the gate of the isolating stage, and electrically connects another end of the diode to a lower power source VDD. Therefore, the magnitude of the VDD will be reduced from the instant voltage difference to protect the isolating stage from damaging when the high voltage HV is enabled.

10 Claims, 2 Drawing Sheets

COUPLING CIRCUIT FOR PREVENTING GATE JUNCTION BREAKDOWN OF FLASH MEMORIES

BACKGROUND OF THE INVENTION

1. Field of the Invention

The present invention relates to a circuit for protecting a flash memory, and particularly to a NMOS coupling circuit for preventing gate junction breakdown of flash memories.

2. Description of Related Art

In the modem industry, coupling circuits of flash memories could be classified into PMOS and NMOS types. The main disadvantage of a PMOS circuit is to have a weak noise immunity, which would cause an erroneous action. On the contrary, a NMOS circuit has stronger noise immunity. However, the breakdown voltage of gate junctions of a NMOS device is less than that of a PMOS circuit so that the gate junctions of a NMOS device cannot be applied by a large voltage.

FIG. 1 shows a NMOS coupling circuit of a prior art in flash memory. The front stage of the coupling circuit 10 is a decoding circuit (not shown), and the rear stage is a flash memory block (not shown) composed of a lot of flash memory unit cells. Two clock signals CLK and CLK_B are input to a third transistor 14 and a fourth transistor 16 through a first coupling capacitor 13 and a second coupling capacitor 15, respectively. A signal ENB_B comes from the decoding circuit and is input to the gate of a fifth transistor 17. When a unit cell corresponding to the coupling circuit is decoded by the front-stage of the decoding circuit, a corresponding signal ENB_B turns to logic one; otherwise, the signal ENB_B stays logic zero. A conducting stage 18 includes a first transistor 11 and a second transistor 12 whose drains are electrically connected to a high voltage HV outputted from a charge pump, and the gates of the first and second transistors 11 and 12 are electrically connected to the drain of the fifth transistor 17. The source of the first transistor 11 outputs a high voltage VEP acting as a power source of the rear-stage flash memory block. When the coupling circuit 10 has not been decoded yet, the signal ENB_B is logic zero and the fifth transistor 17 is active, causing the gate voltages (X point) of the first transistor 11 and the second transistor 12 to be close to 0 Volt. Relative to the high voltage HV at the drain, the drain-gate junction of the first transistor 11 and the second transistor 12 will be loaded with a large voltage difference and thus effect the reliability of the flash memory. If the voltage difference is larger than the breakdown voltage of the flash memory, the first transistor 11 and the second transistor 12 would even be punched through and fail to work.

For eliminating the disadvantages of the prior art, the present invention proposes a novelty coupling circuit for flash memory to overcome the above drawbacks.

SUMMARY OF THE INVENTION

A main object of the present invention is to propose a coupling circuit for preventing gate junction breakdown in a flash memory.

To obtain the above purpose, the present invention adds at least one isolating stage between a conducting stage and a high voltage HV of the prior coupling circuit, and the addition generates a benefit that the voltage difference of the high voltage HV is burdened by both the conducting stage and the isolating stage of the coupling circuit. In other words, the voltage difference in the gate junction of the conducting stage will be reduced, and the probability of punching through a transistor will also be reduced. For reducing the effect of an instant voltage difference when the high voltage HV is enabled, the present invention electrically connects one end of a diode to the gate of the isolating stage, and electrically connects another end of the diode to a lower power source VDD. Therefore, the magnitude of the VDD will be reduced from the instant voltage difference to protect the isolating stage from damaging when the high voltage HV is enabled.

Besides, the present invention could insert a coupling capacitor between the high voltage HV and the gate of the isolating stage to reduce an instant impulse when the high voltage HV is enabled. The present invention could add a discharge path from the gate of the isolating stage to the ground. When the high voltage HV is disabled, the discharge path will be activated to release extra charges accumulated in the gate junction of the isolating stage.

BRIEF DESCRIPTION OF THE DRAWINGS

The present invention will be described according to the appended drawings in which.

PREFERRED EMBODIMENT OF THE PRESENT INVENTION

Figure 1:
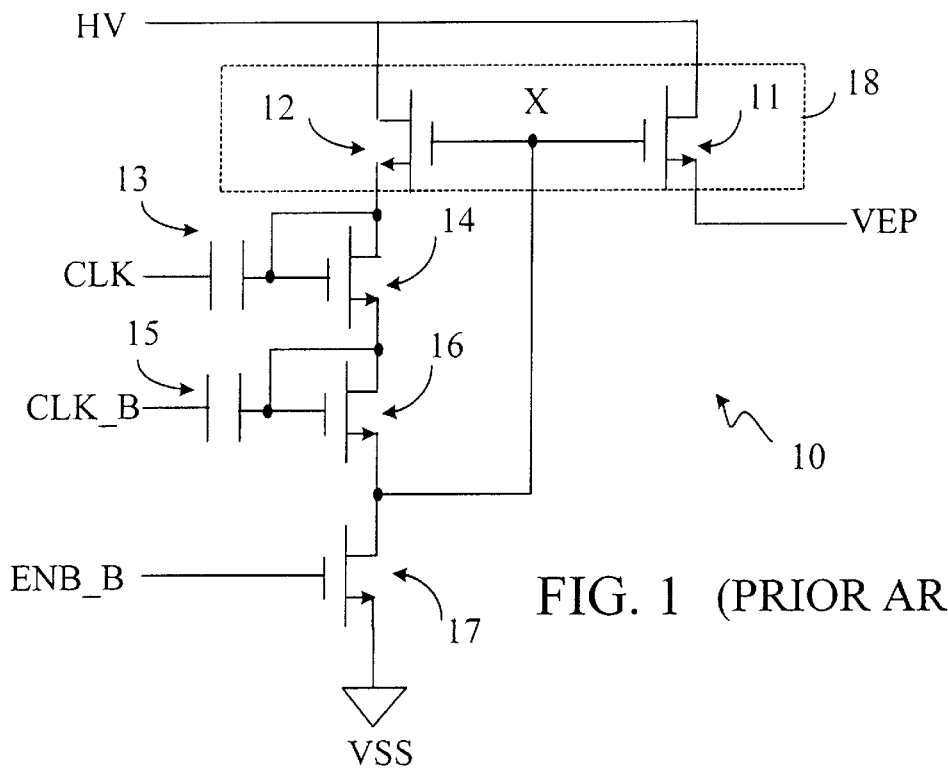
FIG. 1 shows a NMOS coupling circuit of a prior art in flash memory.
Figure 2:
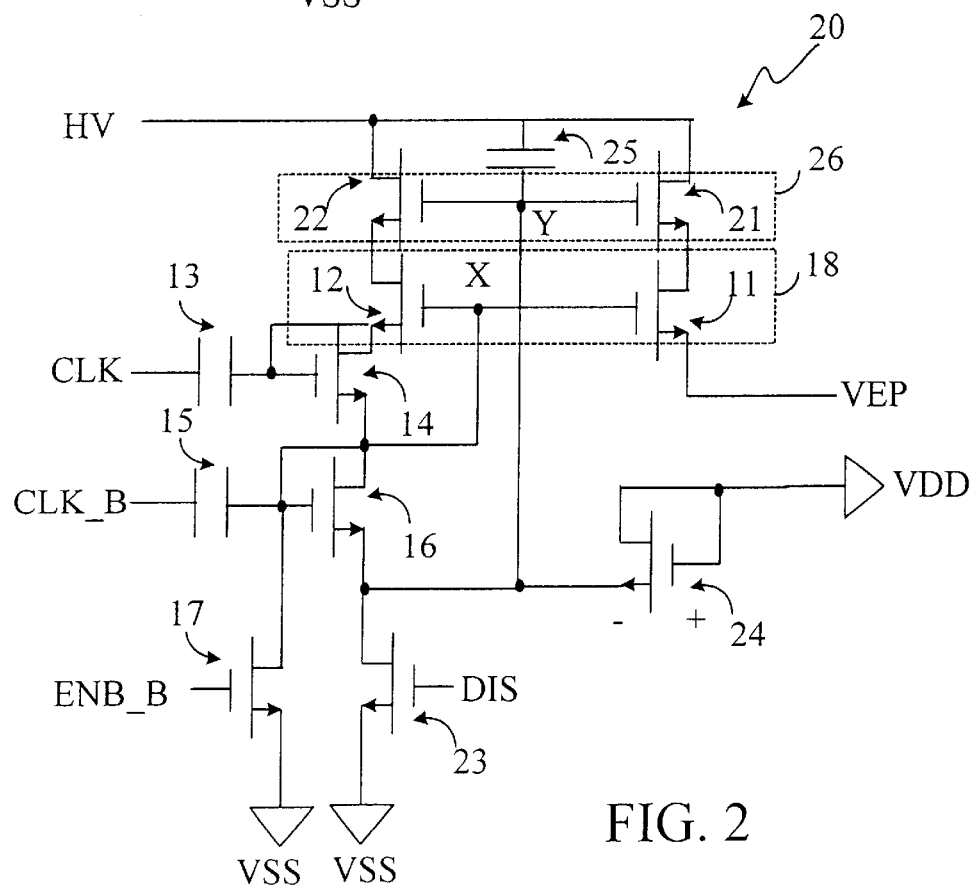
FIG. 2 shows a NMOS coupling circuit of a flash memory according to the present invention.

FIG. 2 shows an NMOS coupling circuit of a flash memory according to the present invention. For preventing the gate-drain junction of the conducting stage 18 (including the first transistor 11 and second transistor 12) from a large voltage drop known in the prior art memory of FIG. 1, at least one isolating stage 26 is inserted between the conducting stage 18 and the high voltage HV (16 Volt adopted hereinafter) according to the present invention. The isolating stage 26 includes a sixth transistor 21 and seventh transistor 22, whose gate terminals (Y points) are further connected to the high voltage HV through a third coupling capacitor 25 to avoid an instant impulse when the high voltage HV is enabled. If the junction capacitance between the sixth transistor 21 and seventh transistor 22 is large enough, the third coupling capacitor 25 could be omitted. The positive end of a diode 24 (or a transistor whose gate and drain terminals are electrically connected) is electrically connected to a low voltage (such as 3.3 Volt), and the negative end of the diode 24 is electrically connected to the gates of the sixth transistor 21 and the seventh transistor 22. Therefore, when the high voltage HV is not enabled, the voltage of the Y point is equal to VDD subtracting the threshold voltage of the diode 24, about 2.8 Volts. When the high voltage HV is enabled, through the diode 24, the voltage of the Y point is raised smoothly. If the size of the first and second transistors 11 and 12 is equal to the size of the sixth and seventh transistors 21 and 22, the voltage of the Y point is almost one half of the high voltage HV, about 8 Volts. As compared with the prior art, the voltage difference between gate and drain terminals of the first and second transistors 11 and 12 according to the present invention will be less than one half of the high voltage HV, and the disadvantage of punching through transistors seen in prior art will be avoided. A discharge path connected to the Y point is created in the present invention. For example, an eighth transistor 23 is added, whose drain is connected to the Y point, whose source is connected to ground and whose gate is connected to a control signal DIS indicating if the high voltage HV is disabled. When the high voltage HV is disabled, the control signal DIS will generate a pulse to conduct the eighth transistor 23, and the voltage of the Y point will slow down gradually to 2.8 Volts through the discharge path formed by the eighth transistor 23.

Figure 3:
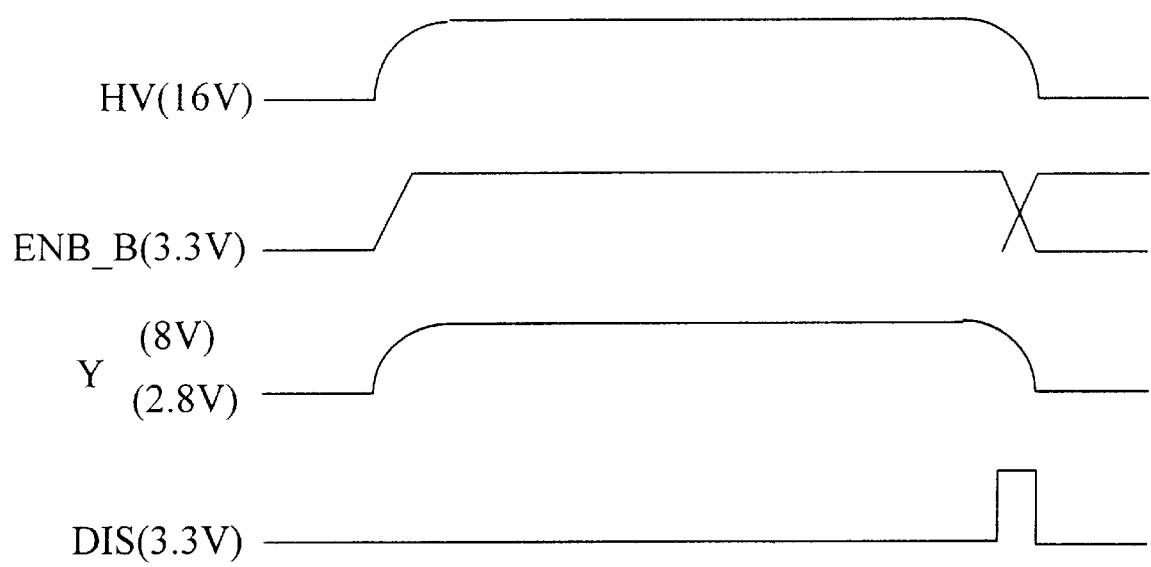
FIG. 3 shows a timing diagram of the structure in FIG. 2.

FIG. 3 shows a timing diagram of the structure in FIG. 2. In the timing diagram, when the flash memory unit cell corresponding to the coupling circuit 20 has not been selected yet, the signal ENB_B stays in logic high. Meanwhile, the high voltage HV is enabled, and the voltage of the Y point is raised gradually from 2.8 Volts to 8 Volts for ensuring the drain and gate voltages of the first and second transistors 11 and 12 and the sixth and the seventh transistors 21 and 22 are not larger than a breakdown voltage. When the high voltage HV is disabled, the control signal DIS generates a small pulse to conduct the eighth transistor 23 to act as a discharge path.

The above-described embodiments of the present invention are intended to be illustrative only. Numerous alternative embodiments may be devised by those skilled in the art without departing from the scope of the following claims.

What is claimed is:

1. A coupling circuit for preventing gate junction breakdown of a flash memory, comprising:
    a high voltage;
    a conducting stage for generating a power source of a rear-stage flash memory block;
    a transistor enabled when the high voltage occurs; and
    at least one isolating stage situated between the high voltage and the conducting stage for reducing a voltage difference of gate junctions of the conducting stage.

2. The coupling circuit of claim 1, wherein a gate terminal of the isolating stage is further connected to a diode whose one end is connected to a low voltage acting as a second power source of the flash memory block.

3. The coupling circuit of claim 1, wherein a gate terminal of is the isolating stage is further connected to the high voltage through a coupling capacitor.

4. The coupling circuit of claim 1, wherein a gate terminal of the isolating stage is further connected to a discharge path enabled when the high voltage is disabled.

5. The coupling circuit of claim 4, wherein the discharge path comprises at least one transistor.

6. A flash memory circuit, comprising:
    a decoding circuit;
    at least one coupling circuit including a high voltage enabled when the decoding circuit does not select the coupling circuit, a conducting stage and a transistor enabled when the high voltage occurs, wherein at least one isolating stage is added between the high voltage and the conducting stage for reducing a voltage difference of gate junctions of the conducting stage; and
    at least one flash memory block utilizing the high voltage as a power source.

7. The flash memory circuit of claim 6, wherein the gate of the isolating stage is further connected to a diode whose one end is connected to a low voltage acting as a second power source of the flash memory block.

8. The flash memory circuit of claim 6, wherein the gate terminal of the isolating stage is further connected to the high voltage through a coupling capacitor.

9. The flash memory circuit of claim 6, wherein the gate terminal of the isolating stage is further connected to a discharge path enabled when the high voltage is disabled.

10. The flash memory circuit of claim 9, wherein the discharge path is formed by at least one transistor.

* * * * *

UNITED STATES PATENT AND TRADEMARK OFFICE
CERTIFICATE OF CORRECTION

PATENT NO. : 6,392,926 B1 Page 1 of 1
DATED : May 21, 2002
INVENTOR(S) : Chung-Meng Huang It is certified that error appears in the above-identified patent and that said Letters Patent is hereby corrected as shown below:

<u>Column 4,</u>
Line 4, "of is the isolating" should read -- of the isolating --

Signed and Sealed this

Nineteenth Day of November, 2002

Attest:

Attesting Officer

JAMES E. ROGAN
Director of the United States Patent and Trademark Office